United States Patent
Yi et al.

(10) Patent No.: US 8,183,577 B2
(45) Date of Patent: May 22, 2012

(54) CONTROLLING PIT FORMATION IN A III-NITRIDE DEVICE

(75) Inventors: Sungsoo Yi, Sunnyvale, CA (US); Nathan F. Gardner, Sunnyvale, CA (US); Qi Laura Ye, Palo Alto, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 0 days.

(21) Appl. No.: 12/495,258

(22) Filed: Jun. 30, 2009

(65) Prior Publication Data
US 2010/0327256 A1 Dec. 30, 2010

(51) Int. Cl.
*H01L 29/72* (2006.01)
(52) U.S. Cl. .......... 257/79; 257/13; 257/86; 257/94; 257/95
(58) Field of Classification Search .......... 257/13, 257/79, 86, 94, 95
See application file for complete search history.

(56) References Cited

U.S. PATENT DOCUMENTS

| 6,121,634 A * | 9/2000 | Saito et al. .......... 257/86 |
| 7,534,638 B2 | 5/2009 | Grillot et al. |
| 2006/0246612 A1 * | 11/2006 | Emerson et al. .......... 438/22 |
| 2007/0072324 A1 | 3/2007 | Krames et al. |

FOREIGN PATENT DOCUMENTS

| GB | 2338107 A | 12/1999 |
| WO | 0058999 A1 | 10/2000 |
| WO | 02103814 A1 | 12/2002 |
| WO | 2009039402 A1 | 3/2009 |

OTHER PUBLICATIONS

By Y. Chen et al., Entitled "Pit formation in GaInN quantum wells", American Institute of Physics, Applied Physics Letters, vol. 72, No. 6, Feb. 9, 1998, Downloaded May 8, 2008 to 161.88.255.139, Redistribution subject to AIP license or copyright; see http://apl.aip.org/apl/copyright.jsp. pp. 710-712.

* cited by examiner

*Primary Examiner* — Edward Wojciechowicz

(57) ABSTRACT

A device includes a semiconductor structure comprising a III-nitride light emitting layer disposed between an n-type region and a p-type region and a plurality of layer pairs disposed within one of the n-type region and the p-type region. Each layer pair includes an InGaN layer and pit-filling layer in direct contact with the InGaN layer. The pit-filling layer may fill in pits formed in the InGaN layer.

13 Claims, 1 Drawing Sheet

CONTROLLING PIT FORMATION IN A III-NITRIDE DEVICE

FIELD OF INVENTION

The present invention relates to controlling pits in indium-containing layers in a III-nitride light emitting device.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions. III-nitride devices are often formed as inverted or flip chip devices, where both the n- and p-contacts formed on the same side of the semiconductor structure, and light is extracted from the side of the semiconductor structure opposite the contacts.

III-nitride substrates are generally expensive and not widely available, thus III-nitride devices are often grown on sapphire or SiC substrates. Such non-III-nitride substrates are less than optimal because sapphire and SiC have different lattice constants than the III-nitride layers grown on them, causing strain and crystal defects in the III-nitride device layers, which can cause poor performance and reliability problems.

A composite substrate, which may have a lattice constant that more closely matches the lattice constant in the light emitting layer in the device, is shown in FIG. 1 and described in US 2007/0072324, which is incorporated herein by reference. Substrate 10 includes a host substrate 12, a seed layer 16, and a bonding layer 14 that bonds host 12 to seed 16. Each of the layers in substrate 10 are formed from materials that can withstand the processing conditions required to grow the semiconductor layers in the device. Device layers 18 are grown on seed layer 16. Bonding layer 14 may be a release layer formed of a material that can be etched by an etch that does not attack device layers 18, thereby releasing device layers 18 and seed layer 16 from host substrate 12. The composition of the layer adjacent to seed layer 16 may be chosen for its lattice constant or other properties, and/or for its ability to nucleate on the material of seed layer 16. In one example, host 12 is sapphire and seed layer 16 is InGaN.

SUMMARY

A device grown on a composite substrate may require a thick InGaN region. It is an object of the invention to include in a III-nitride device a structure that alternates between InGaN layers and layers of another material. The structure functions as a thick InGaN region and the layers of another material may fill in pits in the InGaN layers.

In embodiments of the invention, a device includes a semiconductor structure comprising a III-nitride light emitting layer disposed between an n-type region and a p-type region and a plurality of layer pairs disposed within one of the n-type region and the p-type region. Each layer pair includes an InGaN layer and a pit-filling layer in direct contact with the InGaN layer. The pit-filling layer may fill in pits formed in the InGaN layer.

DETAILED DESCRIPTION

Figure 1:
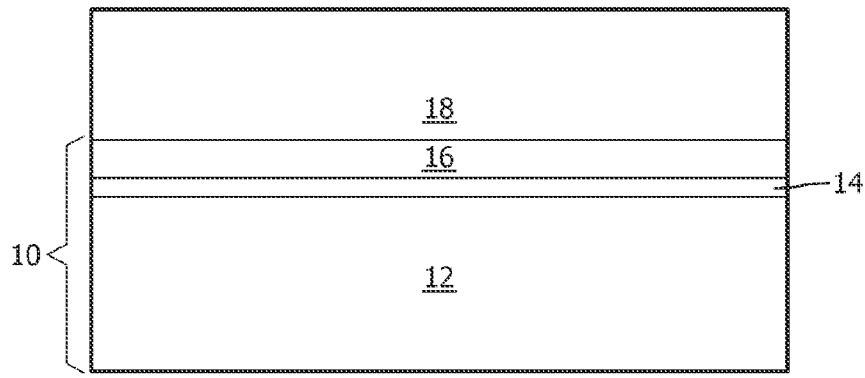
FIG. 1 illustrates III-nitride device layers grown on a composite substrate.

As used herein, an "in-plane" lattice constant refers to the actual lattice constant of a layer within the device, and a "bulk" lattice constant refers to the lattice constant of relaxed, free-standing material of a given composition. The amount of strain in a layer is defined in Eq (1).

$$\text{strain} = \epsilon = (a_{in\text{-}plane} - a_{bulk})/a_{bulk} \quad (1)$$

Note that strain, $\epsilon$, in Eq. (1) can be either positive or negative, i.e., $\epsilon > 0$ or $\epsilon < 0$. In an unstrained film, $a_{in\text{-}plane} = a_{bulk}$, so $\epsilon = 0$ in Eq. (1). A film where $\epsilon > 0$ is said to be under tensile strain, or under tension, while a film where $\epsilon < 0$ is said to be under compressive strain, or under compression. Examples of tensile strain include a strained AlGaN film grown over unstrained GaN, or a strained GaN film grown over unstrained InGaN. In both cases, the strained film has a bulk lattice constant that is smaller than the bulk lattice constant of the unstrained layer on which it is grown, so the in-plane lattice constant of the strained film is stretched to match that of the unstrained layer, giving $\epsilon > 0$ in Eq. (1), according to which the film is said to be under tension. Examples of compressive strain include a strained InGaN film grown over unstrained GaN, or a strained GaN film grown over unstrained AlGaN. In both cases, the strained film has a bulk lattice constant that is larger than the bulk lattice constant of the unstrained layer on which it is grown, so the in-plane lattice constant of the strained film is compressed to match that of the unstrained layer, giving $\epsilon < 0$ in Eq. (1), according to which the film is said to be under compression.

In a conventional III-nitride device grown on a sapphire substrate, typically a GaN layer grown close to the substrate (i.e., directly on the substrate or over one or more nucleation or buffer layers grown first on the substrate) sets the in-plane lattice constant for the light emitting layers grown over it. GaN has a smaller bulk lattice constant than the InGaN light emitting layers in the light emitting region. Accordingly, the InGaN light emitting layers in a conventional device are under compressive strain, which may limit the thickness of the light emitting layers and the amount of InN that can be incorporated in the light emitting layer, which may limit the emission wavelength.

Various methods to reduce the compressive strain in the light emitting layers by increasing the lattice constant of the layer that sets the in-plane lattice constant in the light emitting layers have been proposed. Two examples are strain-reducing templates grown on sapphire, as described in U.S. Pat. No. 7,534,638, which is incorporated herein by reference, and the composite substrate described above. In both strain-reducing template devices and devices grown on composite substrates, the layer that sets the in-plane lattice constant in the light emitting layers (referred to herein as the "lattice constant setting layer") may be InGaN.

InGaN growth conditions often cause pits to form on the surface of the InGaN layer. A high density of large pits may cause inhomogeneous InN composition in the light emitting layer and may enhance the incorporation of impurities in the light emitting layer, which may result in poor device performance and reliability problems. Problems associated with pits may increase as the thickness of an InGaN layer and/or the InN composition in the InGaN layer increases.

In devices with an InGaN lattice constant setting layer, thick GaN layers are generally not grown over the InGaN lattice constant setting layer, since thick GaN layers grown over the InGaN lattice constant setting layer would be under tension and therefore susceptible to cracking. As a result, the n-contact is often formed on an n-type InGaN layer, rather than on an n-type GaN layer. Particularly in a flip chip device, the n-type InGaN layer must be thick enough to provide sufficient lateral current spreading for the device design. At a thickness large enough to provide current spreading, an InGaN layer may have a high density of large pits, which may cause the poor device performance and reliability problems described above.

In embodiments of the invention, the size and density of pits is controlled by including a pit-filling structure in a III-nitride device. The pit-filling structure includes alternating layers of InGaN and a material grown under conditions that fill in pits formed in InGaN layers.

Figure 2:
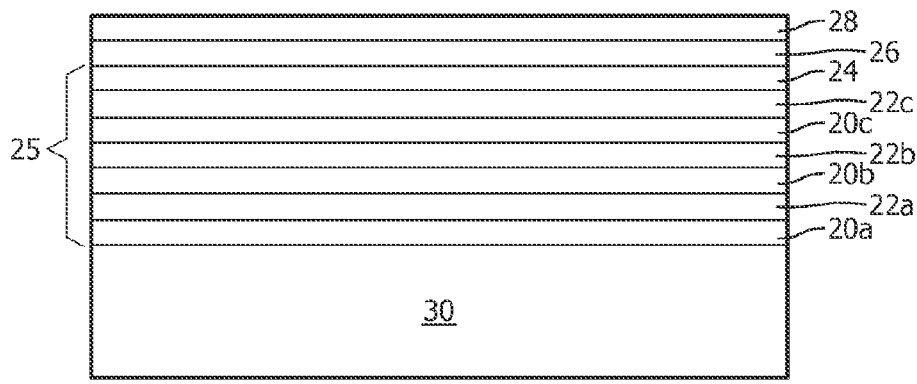
FIG. 2 illustrates the layers in device according to embodiments of the invention.

FIG. 2 illustrates the layers in a device according to embodiments of the invention. The semiconductor layers are grown over a structure 30 which may be, for example, a composite substrate or a strain-reducing template formed on a sapphire substrate. An InGaN lattice constant setting layer 20a is grown over the structure 30. A pit-filling layer 22a may be grown over lattice constant setting layer 20a. The sequence of an InGaN layer followed by a pit-filling layer may be repeated multiple times. For example, in the structure shown in FIG. 2, three InGaN layers 20a, 20b, and 20c and three pit-filling layers 22a, 22b, and 22c are illustrated. Between 2 and 50 layer pairs are included in some embodiments; between 5 and 25 layer pairs are included in some embodiments.

Pit-filling layers 22a, 22b, and 22c have a different composition from InGaN layers 20a, 20b, and 20c. Pit-filling layers may be, for example, aluminum-containing layers, GaN, AlGaN, AlInN, or AlInGaN. All of the pit-filling layers in the device may have the same composition, though they need not. Similarly, all of the InGaN layers in the device may have the same composition, though they need not. The InGaN layers may have an InN composition between 1% and 15% in some embodiments, between 3% and 10% in some embodiments, and 6% in some embodiments. AlGaN, AlInN, or AlInGaN pit-filling layers may have an AlN composition between greater than 0% and 10% in some embodiments, between 3% and 10% in some embodiments, between 6% and 8% in some embodiments, and between 1 and 5% in some embodiments.

InGaN layers 20a, 20b, and 20c may each be, for example, between 100 and 500 nm thick. The thickness of the InGaN layers is selected to be thin enough to avoid the formation of a high density of large pits. Pit-filling layers 22a, 22b, and 22c may each be, for example, between 10 and 50 nm thick in some embodiments, and between 10 and 30 nm thick in some embodiments. The thickness of the pit-filling layers is selected to be thick enough to at least partially fill in the pits in the underlying InGaN layer. All of the pit-filling layers in the device may have the same thickness, though they need not. All of the InGaN layers in the device may have the same thickness, though they need not. Pits present on the surface of the InGaN layers are gradually filled by inserting pit-filling layers between the InGaN layers. Accordingly, InGaN layers closer to the active region 26 may have fewer and shallower pits than InGaN layers closer to structure 30. In some embodiments, the pit-filling layers may be under tension. In such embodiments, the pit-filling layers are kept thin enough to avoid cracking.

The pit-filling layers may be grown under different growth conditions than the InGaN layers. The growth conditions of the pit-filling layers, such as, for example, pressure, temperature, $NH_3$ flow rate, and type of carrier gas, may be selected to favor the filling of pits. For example, the pit-filling layers may be grown under increased temperature, under increased ammonia concentration, and/or at a slow growth rate, as compared with the growth conditions of the InGaN layers. Both the InGaN layers and the pit-filling layers are high quality, substantially single crystal layers grown at high temperature. The pit-filling layers are grown at a temperature greater than 900° C. in some embodiments, greater than 1000° C. in some embodiments, between 1020 and 1060° C. in some embodiments, and between 920 and 1040° C. in some embodiments. For example, AlGaN pit-filling layers may be grown at a temperature between 920 and 1040° C.; GaN pit-filling layers may be grown at a temperature between 1020 and 1060° C. In some embodiments, both the InGaN layers and the pit-filling layers are doped n-type, for example, with Si.

An n-type region 24 is grown over the last pit-filling layer 22c. N-type region 24 may include multiple layers of different compositions and dopant concentration including, for example, preparation layers which may be n-type or not intentionally doped, release layers designed to facilitate later release of the growth substrate or thinning of the semiconductor structure after substrate removal, and n- or even p-type device layers designed for particular optical or electrical properties desirable for the light emitting region to efficiently emit light. N-type region 24 may be, for example, a single n-type InGaN layer.

The semiconductor structure 25 on the n-side of the active region 26 includes the InGaN layers (20a, 20b, and 20c in the device shown in FIG. 2), the pit-filling layers (22a, 22b, and 22c in the device shown in FIG. 2), and n-type region 24. The total thickness of n-structure 25 may be, for example at least 500 nm in some embodiments, between 1000 nm and 5000 nm in some embodiments, between 1500 and 2500 nm in some embodiments, and 2000 nm in some embodiments. The total thickness may depend on how far current must spread laterally in the n-structure: greater current spreading distances may require a thicker n-structure.

A light emitting or active region 26 is grown over n-type region 24. Examples of suitable light emitting regions include a single thick or thin light emitting layer, or a multiple quantum well light emitting region including multiple thin or thick quantum well light emitting layers separated by barrier layers. For example, a multiple quantum well light emitting region may include multiple light emitting layers, each with a thickness of 25 Å or less, separated by barriers, each with a thickness of 100 Å or less. In some embodiments, the thickness of each of the light emitting layers in the device is thicker than 50 Å.

A p-type region 28 is grown over light emitting region 26. Like the n-type region, the p-type region may include multiple layers of different composition, thickness, and dopant concentration, including layers that are not intentionally doped, or n-type layers. The p-type region 28 may also include a pit-filling structure of alternating InGaN layers and pit-filling layers. A pit-filling structure in p-type region 28 may be doped p-type with, for example, Mg.

Figure 3:
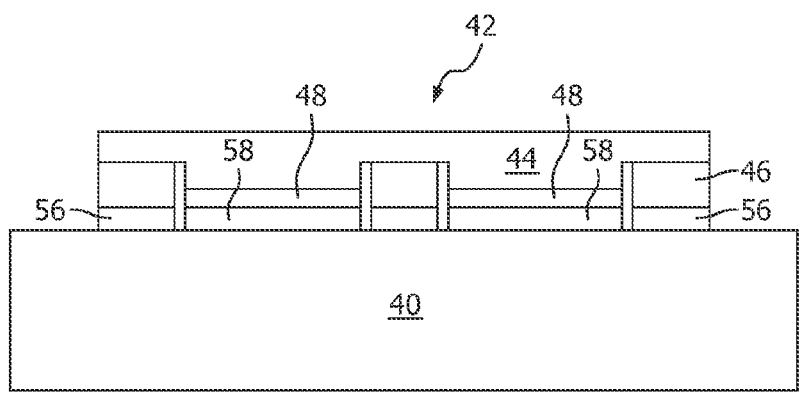
FIG. 3 illustrates a flip chip III-nitride device attached to a mount.

FIG. 3 illustrates an LED 42 connected to a mount 40. Before or after forming a p-contact 48 on p-type region 28 (FIG. 2), portions of an n-type region are exposed by etching away portions of the p-type region and the light emitting region. The semiconductor structure, including lattice constant setting layer 20a, p-type region 28, and all the layers between illustrated in FIG. 2, is represented by structure 44 in FIG. 3. N-contact 46 is formed on the exposed portions of the n-type region.

LED 42 is bonded to mount 40 by n- and p-interconnects 56 and 58. Interconnects 56 and 58 may be any suitable material, such as solder or other metals, and may include multiple layers of materials. In some embodiments, interconnects include at least one gold layer and the bond between LED 42 and mount 40 is formed by ultrasonic bonding.

During ultrasonic bonding, the LED die 42 is positioned on a mount 40. A bond head is positioned on the top surface of the LED die, often the top surface of a sapphire growth substrate in the case of a III-nitride device grown on sapphire. The bond head is connected to an ultrasonic transducer. The ultrasonic transducer may be, for example, a stack of lead zirconate titanate (PZT) layers. When a voltage is applied to the transducer at a frequency that causes the system to resonate harmonically (often a frequency on the order of tens or hundreds of kHz), the transducer begins to vibrate, which in turn causes the bond head and the LED die to vibrate, often at an amplitude on the order of microns. The vibration causes atoms in the metal lattice of a structure on the LED 42 to interdiffuse with a structure on mount 40, resulting in a metallurgically continuous joint. Heat and/or pressure may be added during bonding.

After bonding LED die 42 to mount 40, all or part of the structure 30 on which the semiconductor layers were grown may be removed by any technique suitable to a particular structure removed. For example, the host 12 of a composite substrate shown in FIG. 1 may be removed by etching bonding layer 14 of FIG. 1, or by any other suitable technique. The seed layer 16 shown in FIG. 1 may remain in the device or be removed, for example by etching. A sapphire substrate on which a strain-reducing template is grown may be removed for example by laser lift off. The strain-reducing template may remain in the device or be removed. After removing all or part of structure 30, the remaining semiconductor structure may be thinned, for example by photoelectrochemical etching, and/or the surface may be roughened or patterned, for example with a photonic crystal structure. A lens, wavelength converting material, or other structure known in the art may be disposed over LED 42 after substrate removal.

Although an embodiment disposing layer pairs on one side of an n-type region are describe with respect to FIG. 3, other embodiments are contemplated and are included within the scope of the invention. An alternative embodiment places the layer pairs within the n-type region. Another embodiment places the layer pairs within the p-type region.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
  a semiconductor structure comprising:
    a III-nitride light emitting layer disposed between an n-type region and a p-type region, wherein the n-type region comprises an InGaN contact layer; and
    a plurality of layer pairs disposed within one of the n-type region and the p-type region, each layer pair comprising:
      an InGaN layer; and
      a pit-filling layer in direct contact with the InGaN layer, wherein the pit filling layer is one of GaN, AlGaN, AlInGaN, and AlInN; and
    a metal contact disposed on a portion of the InGaN contact layer.

2. The device of claim 1 wherein each pit-filling layer is GaN.

3. The device of claim 1 wherein each pit-filling layer is AlGaN.

4. The device of claim 3 wherein each pit-filling layer has an AlN composition between 3% and 10%.

5. The device of claim 1 wherein each pit-filling layer is AlInGaN.

6. The device of claim 5 wherein each pit-filling layer has an AlN composition between 3% and 10%.

7. The device of claim 1 wherein each InGaN layer has an InN composition between 3% and 10%.

8. The device of claim 1 wherein each InGaN layer has a thickness between 100 and 500 nm.

9. The device of claim 1 wherein each pit-filling layer has a thickness between 10 and 50 nm.

10. The device of claim 1 further comprising a plurality of pits disposed on a top surface of the InGaN layer in one of the layer pairs, wherein a size of the plurality of pits on the top surface of the InGaN layer is greater than a size of a plurality of pits disposed on a top surface of the pit-filling layer in the same layer pair.

11. The device of claim 1 wherein between 2 and 50 layer pairs are included in the semiconductor structure.

12. The device of claim 1 wherein portions of the light emitting layer and p-type region are removed to expose portions of the n-type region and the metal contact is a first metal contact disposed on the exposed portions of the n-type region, the device further comprising:
  a second metal contact disposed on the p-type region;
  wherein the first metal contact and the second metal contact are disposed on a same side of the semiconductor structure.

13. The device of claim 1 wherein each pit-filling layer is a substantially single crystal layer.

* * * * *